(12) United States Patent
Oh et al.

(10) Patent No.: US 9,236,189 B2
(45) Date of Patent: Jan. 12, 2016

(54) DIRECT CURRENT CAPACITOR MODULE

(71) Applicant: SAMHWA CAPACITOR CO., LTD., Yongin-si (KR)

(72) Inventors: Young Joo Oh, Seoul (KR); Jung Rag Yoon, Yongin-si (KR); Kyung Min Lee, Paju-si (KR); Young Min Yoo, Suwon-si (KR)

(73) Assignee: SAMHWA CAPACITOR CO., LTD. (KR)

( * ) Notice: Subject to any disclaimer, the term of this patent is extended or adjusted under 35 U.S.C. 154(b) by 267 days.

(21) Appl. No.: 14/014,773

(22) Filed: Aug. 30, 2013

(65) Prior Publication Data

US 2014/0085772 A1    Mar. 27, 2014

(30) Foreign Application Priority Data

Sep. 27, 2012 (KR) .................. 10-2012-0107774

(51) Int. Cl.

| | |
|---|---|
| *H01G 4/38* | (2006.01) |
| *H01G 4/40* | (2006.01) |
| *H01G 2/06* | (2006.01) |
| *H05K 1/02* | (2006.01) |
| *H05K 1/11* | (2006.01) |
| *H05K 3/30* | (2006.01) |
| *H05K 3/46* | (2006.01) |

(52) U.S. Cl.
CPC . *H01G 4/38* (2013.01); *H01G 2/06* (2013.01); *H01G 4/40* (2013.01); *H05K 1/0231* (2013.01); *H05K 1/116* (2013.01); *H05K 3/306* (2013.01); *H05K 3/4641* (2013.01); *H05K 2201/09309* (2013.01); *H05K 2201/09345* (2013.01); *H05K 2201/09718* (2013.01); *H05K 2201/1034* (2013.01); *Y02T 10/7022* (2013.01)

(58) Field of Classification Search
USPC ............... 361/328, 329, 306, 1, 306.3, 301.4, 361/301.2, 321.1, 321.2, 766, 775, 777
See application file for complete search history.

(56) References Cited

U.S. PATENT DOCUMENTS

| | | | |
|---|---|---|---|
| 7,345,868 B2 | 3/2008 | Trinh | |
| 8,054,608 B2 * | 11/2011 | Yoon et al. .................. | 361/321.4 |
| 8,369,100 B2 * | 2/2013 | Azuma et al. ................. | 361/766 |

FOREIGN PATENT DOCUMENTS

KR    1020090050118    5/2009

\* cited by examiner

*Primary Examiner* — Nguyen T Ha
(74) *Attorney, Agent, or Firm* — Cantor Colburn LLP

(57) ABSTRACT

A direct current (DC) link capacitor module includes a printed circuit board (PCB) formed by sequentially disposing a first electrode substrate, an insulation substrate, a second electrode substrate, a third electrode substrate; a plurality of DC link capacitors connected in parallel to each of the first electrode substrate and the second electrode substrate; a plurality of first Y-capacitors connected in series to each of the first electrode substrate and the third electrode substrate, and connected in parallel to the DC link capacitors; and a plurality of second Y-capacitors connected in series to each of the first electrode substrate and the third electrode substrate, and connected in parallel to the first Y-capacitors, thereby achieving a miniaturization and facilitating a fabrication by connecting the plurality of DC link capacitors using the PCB.

11 Claims, 7 Drawing Sheets

DIRECT CURRENT CAPACITOR MODULE

CROSS-REFERENCE TO RELATED APPLICATION

This application claims the benefit of Korean Patent Application No. 10-2012-0107774, filed on Sep. 27, 2012, in the Korean Intellectual Property Office, the disclosure of which is incorporated herein by reference.

BACKGROUND OF THE INVENTION

1. Field of the Invention

The present invention relates to a direct current (DC) link capacitor module, and more particularly, to a DC link capacitor module that may achieve a miniaturization and facilitate a fabrication by connecting a plurality of DC link capacitors using a printed circuit board (PCB).

2. Description of the Related Art

An electric power transmission device of an electric vehicle or a hybrid vehicle, for example, a vehicle using an electrical driving source, includes a battery, a direct current (DC) link capacitor module, an inverter, and a motor.

The battery is used as a power source and the motor is used as a driving source. The inverter receives a pulse width modulation (PWM) duty signal output from a micro process unit (MCU) in order to control a driving velocity and a torque of the motor. The inverter is switched based on the received PWM duty signal, converts DC power output from the battery to alternating current (AC) power, applies the converted power to the motor, and thereby drives the vehicle. The DC link capacitor module smoothens and stabilizes the DC power supplied to the inverter, decreases current ripple, and thereby enables the DC power to be stably supplied to the inverter.

Korean Registration Patent No. 925952 (Patent Document 1), registered on Nov. 2, 2009, discloses a film capacitor module of an inverter having an enhanced cooling performance. Here, a film capacitor module is used for a DC link capacitor module. The film capacitor module configures a single film capacitor cell module by using, as a single group, the respective two film capacitor unit cells disposed in an upper portion and a lower portion. In this instance, the film capacitor module configures a single film capacitor cell module by connecting and thereby installing anode and cathode bus bars at both ends of up and down two film capacitor unit cells, and configures a required capacity of the film capacitor module by combining the configured film capacitor cell module into a plurality of units.

As disclosed in Patent Document 1, in the case of configuring the film capacitor module by connecting a film capacitor that is a DC link capacitor module using a bus bar, the DC link capacitor module may not be miniaturized and a fabrication may become complex. Further, high frequency ripple current may occur due to an increase in equivalent serial resistance (ESR) by the bus bar. Due to the high frequency ripple current, reliability of the DC link capacitor module may be degraded.

SUMMARY OF THE INVENTION

An aspect of the present invention provides a direct current (DC) link capacitor module that may achieve a miniaturization and facilitate a fabrication by connecting a plurality of DC link capacitors using a printed circuit board (PCB).

Another aspect of the present invention also provides a DC link capacitor module that may enhance an equivalent serial resistance (ESR) characteristic by connecting a plurality of DC link capacitors using a PCB and thereby prevent degradation in product performance occurring due to high frequency ripple current.

According to an aspect of the present invention, there is provided a DC link capacitor module, including: a PCB formed by sequentially disposing a first electrode substrate, an insulation substrate, a second electrode substrate, a third electrode substrate; a plurality of DC link capacitors connected in parallel to each of the first electrode substrate and the second electrode substrate; a plurality of first Y-capacitors connected in series to each of the first electrode substrate and the third electrode substrate, and connected in parallel to the DC link capacitors; and a plurality of second Y-capacitors connected in series to each of the first electrode substrate and the third electrode substrate, and connected in parallel to the first Y-capacitors.

BRIEF DESCRIPTION OF THE DRAWINGS

The above and/or other aspects of the present invention will become apparent and more readily appreciated from the following description of the exemplary embodiments, taken in conjunction with the accompanying drawings in which.

DETAILED DESCRIPTION OF THE INVENTION

Figure 1:
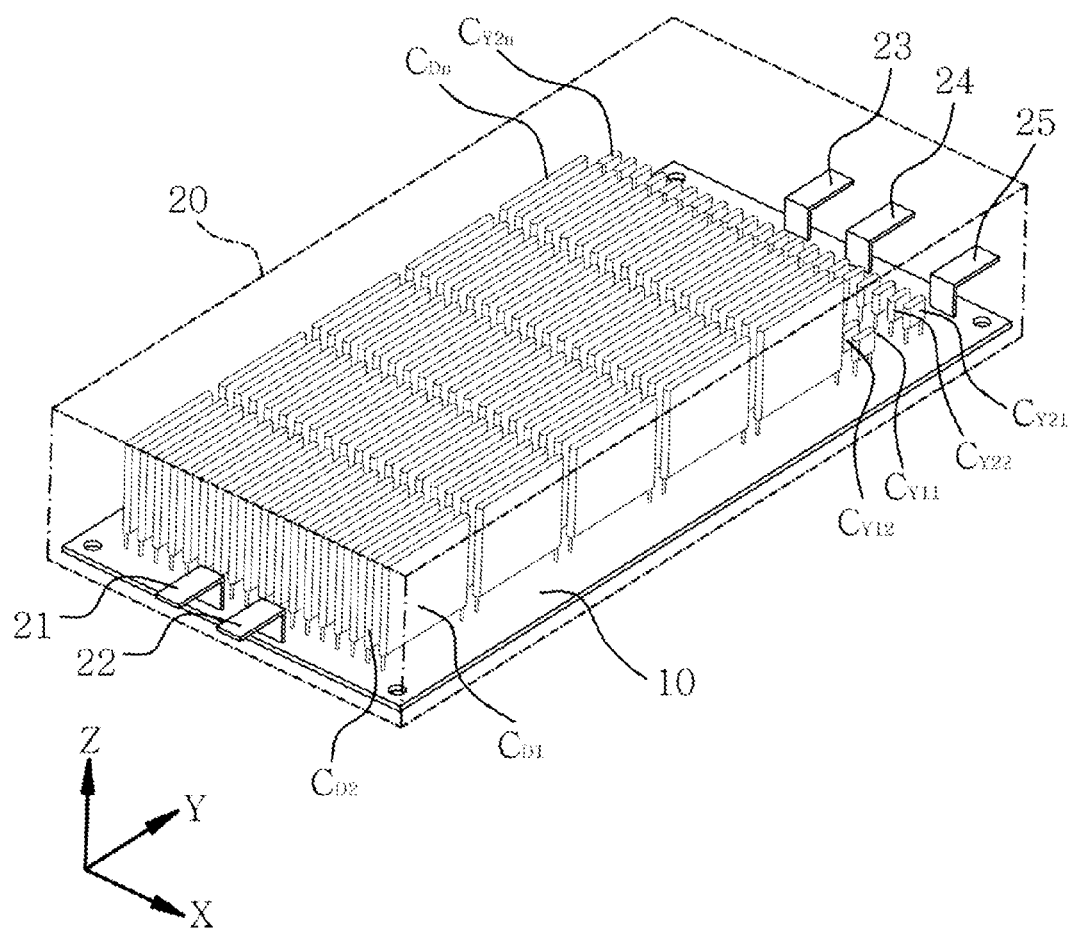
FIG. 1 is a perspective view of a direct link (DC) link capacitor module according to an embodiment of the present invention.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

Embodiments of a direct current (DC) link capacitor module of the present invention will be described with reference to the accompanying drawings.

Figure 2:
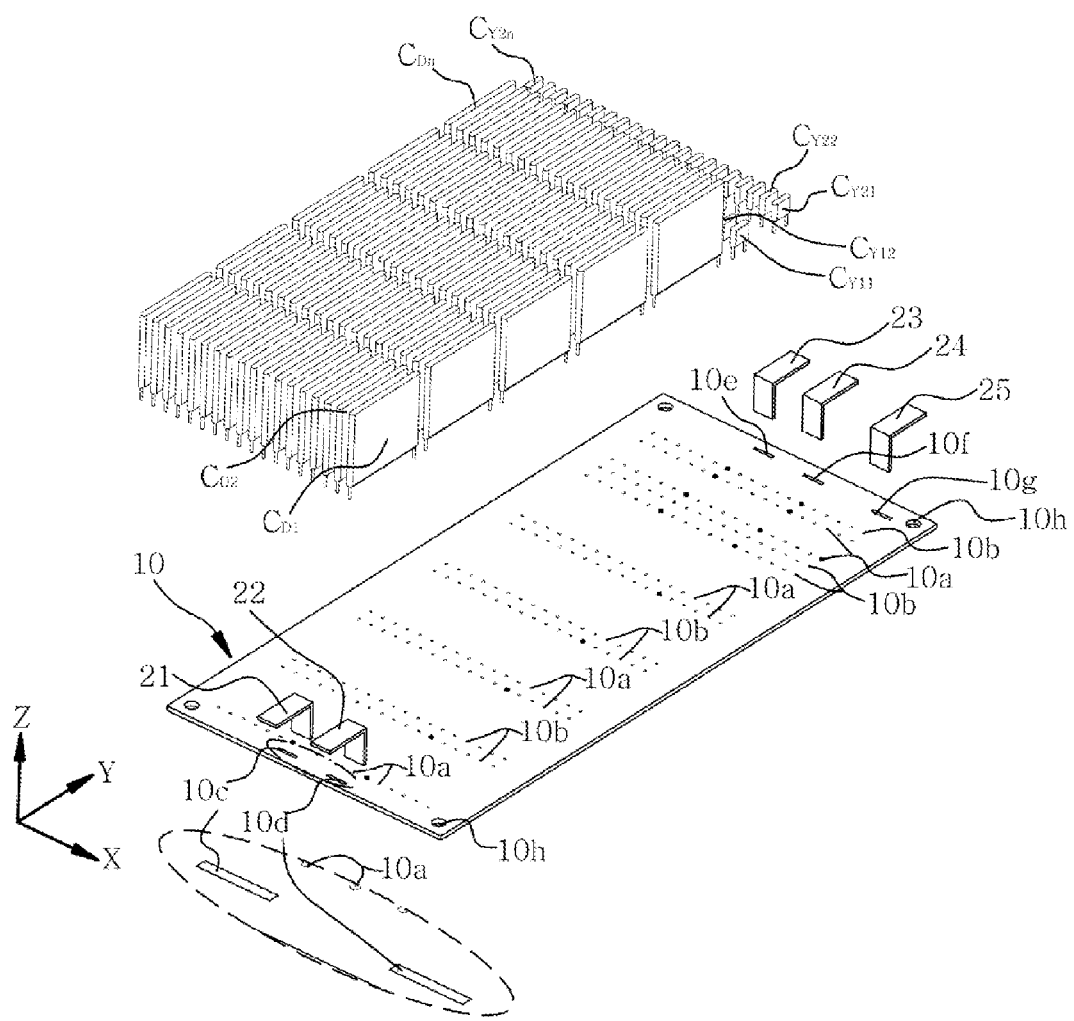
FIG. 2 is an exploded perspective view of the DC link capacitor module of FIG. 1.

As illustrated in FIGS. 1 and 2, the DC link capacitor module of the present invention includes a printed circuit board (PCB) 10, a plurality of DC link capacitors ($C_{D1}$, $C_{D2}$, ..., $C_{Dn}$), the a plurality of first Y-capacitors ($C_{Y11}$, $C_{Y12}$, ..., $C_{Y1n}$), and a plurality of second Y-capacitors ($C_{Y21}$, $C_{Y22}$, ..., $C_{Y2n}$).

The PCB 10 is formed by sequentially disposing a first electrode substrate 12, an insulation substrate 11, a second electrode substrate 13, and a third electrode substrate 14, and the plurality of DC link capacitors ($C_{D1}$, $C_{D2}$, ..., $C_{Dn}$) is connected in parallel to each of the first electrode substrate 12 and the second electrode substrate 13. Here, the third electrode substrate 14 is formed on one side of the second electrode substrate 13 to be electrically separate from the second electrode substrate 13. The plurality of first Y-capacitors ($C_{Y11}, C_{Y12}, \ldots, C_{Y1n}$) is connected in series to each of the first electrode substrate 12 and the third electrode substrate 14, and connected in parallel to the DC link capacitor ($C_{D1}, C_{D2}, \ldots, C_{Dn}$). The plurality of second Y-capacitors ($C_{Y21}, C_{Y22}, \ldots, C_{Y2n}$) is connected in series to each of the first electrode substrate 12 and the third electrode substrate 14, and connected in parallel to the first Y-capacitors ($C_{Y11}, C_{Y12}, \ldots, C_{Y1n}$).

Hereinafter, a configuration of the DC link capacitor module of the present invention configured as above will be described in detail with reference to the accompanying drawings.

As illustrated in FIGS. 2 through 5, the PCB 10 is formed by sequentially disposing the insulation substrate 11, the first electrode substrate 12, the second electrode substrate 13, the third electrode substrate 14, and an insulating cover substrate 15.

Figure 4:
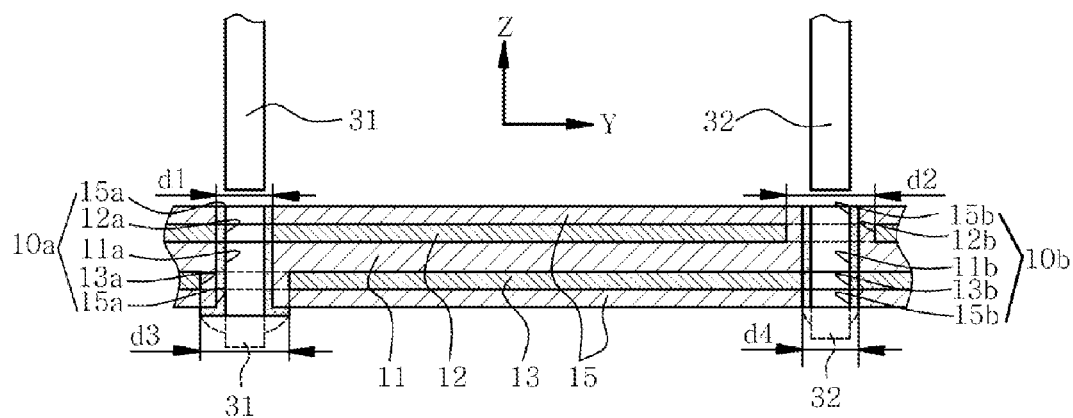
FIGS. 4 through 6 are partially enlarged cross-sectional views of the PCB of FIG. 2.

As illustrated in FIG. 4, the insulation substrate 11 is formed so that a single pair of first via holes 11a and 11b into which leads 31 and 32 of the DC link capacitors ($C_{D1}, C_{D2}, \ldots, C_{Dn}$), the first Y-capacitors ($C_{Y11}, C_{Y12}, \ldots, C_{Y1n}$), or the second Y-capacitors ($C_{Y21}, C_{Y22}, \ldots, C_{Y2n}$) are inserted is formed in a matrix form. The single pair of first via holes 11a and 11b is spaced apart from each other at a predetermined interval and arranged in a first direction (X). At least one pair thereof is formed to cross and spaced apart from each other in a second direction (Y) orthogonal to the first direction X.

Figure 3:
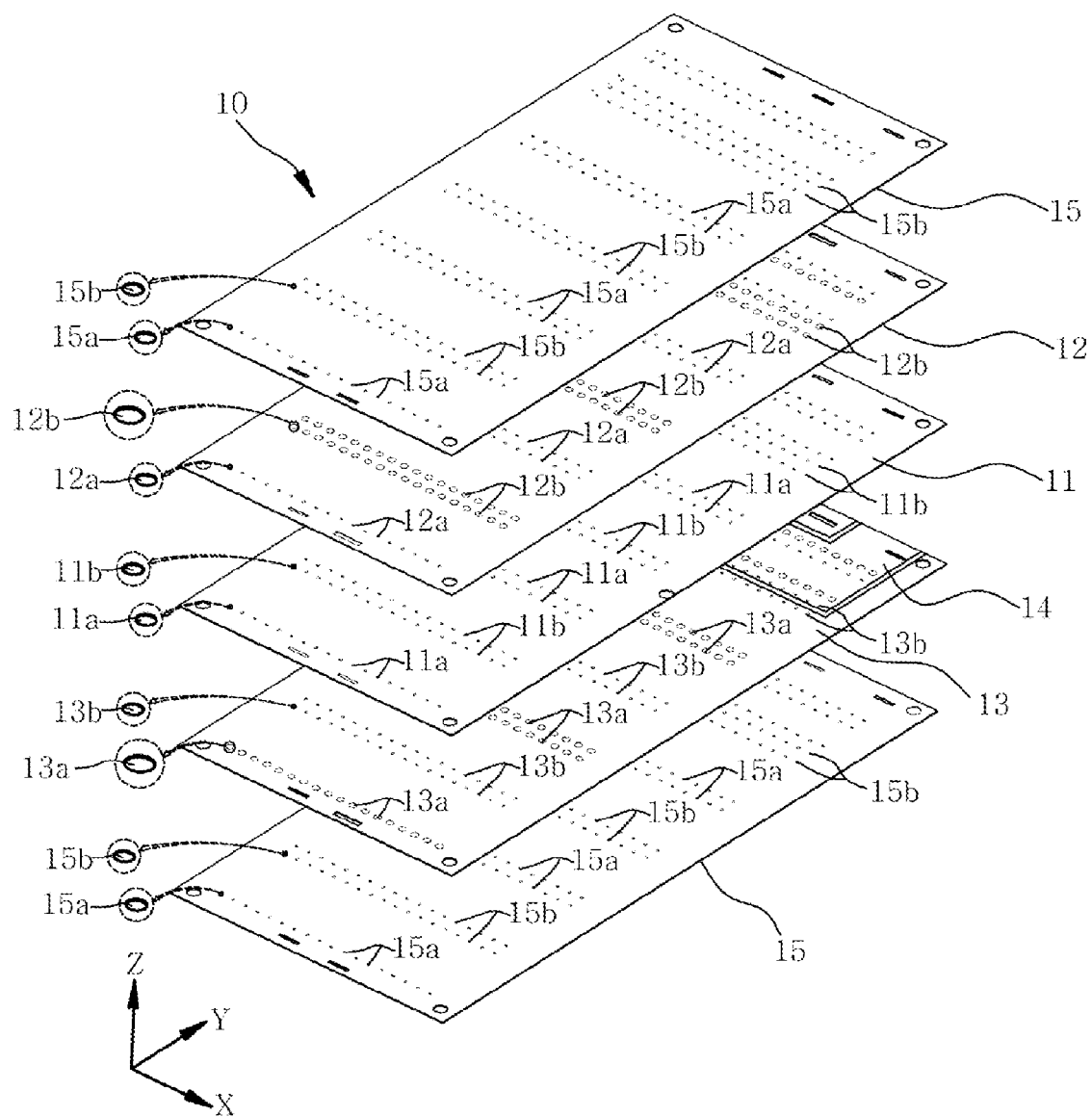
FIG. 3 is an exploded perspective view of a printed circuit board (PCB) of FIG. 2.

As illustrated in FIGS. 3 and 4, the first electrode substrate 12 is formed on the whole top surface of the insulation substrate 11, and formed with a single pair of second via holes 12a and 12b into which leads 31 and 32 of the DC link capacitors ($C_{D1}, C_{D2}, \ldots, C_{Dn}$), the first Y-capacitors ($C_{Y11}, C_{Y12}, \ldots, C_{Y1n}$), or the second Y-capacitors ($C_{Y21}, C_{Y22}, \ldots, C_{Y2n}$) are inserted, at the respective positions corresponding to the single pair of first via holes 11a and 11b. A diameter d1 of the second via hole 12a of the single pair of second via holes 12a and 12b is formed to be less than a diameter d2 of the remaining second via hole 12b, thereby enabling the first electrode substrate 12 to be electrically connected to the first via hole 11a and enabling one lead 131 of the leads 31 and 32. The other one second via hole 12b enables the first electrode substrate 12 not to be electrically connected to the first via hole 11a. That is, a conductive metal material is applied on the inner circumferential surface of the second via hole 12a, and is not applied on the inner circumferential surface of the second via hole 12b.

As illustrated in FIGS. 3 and 4, the second electrode substrate 13 is formed below the insulation substrate 11, and formed with a single pair of third via holes 13a and 13b into which leads 31 and 32 of the DC link capacitors ($C_{D1}, C_{D2}, \ldots, C_{Dn}$) are inserted, at the respective positions corresponding to the single pair of first via holes 11a and 11b. A diameter d3 of the third via hole 13a of the single pair of third via holes 13a and 13b is formed to be greater than a diameter d4 of the remaining third via hole 13b thereof, thereby enabling one lead 31 of the leads 31 and 32 not to be electrically connected to the second electrode substrate 13 and enabling the other one lead 32 to be electrically connected to the first electrode substrate 12. That is, between the single pair of third via holes 13a and 13b, the third via hole 13a is formed at a position corresponding to the first via hole 11a, thereby enabling the second electrode substrate 13 not to be electrically connected to the first via hole 11a. The third via hole 13b is formed at a position corresponding to the first via hole 11b, thereby enabling the second electrode substrate 13 to be electrically connected to the first via hole 11b and enabling the lead 32 inserted and thereby installed into the first via hole 11b to be connected to the second electrode substrate 13.

Figure 10:
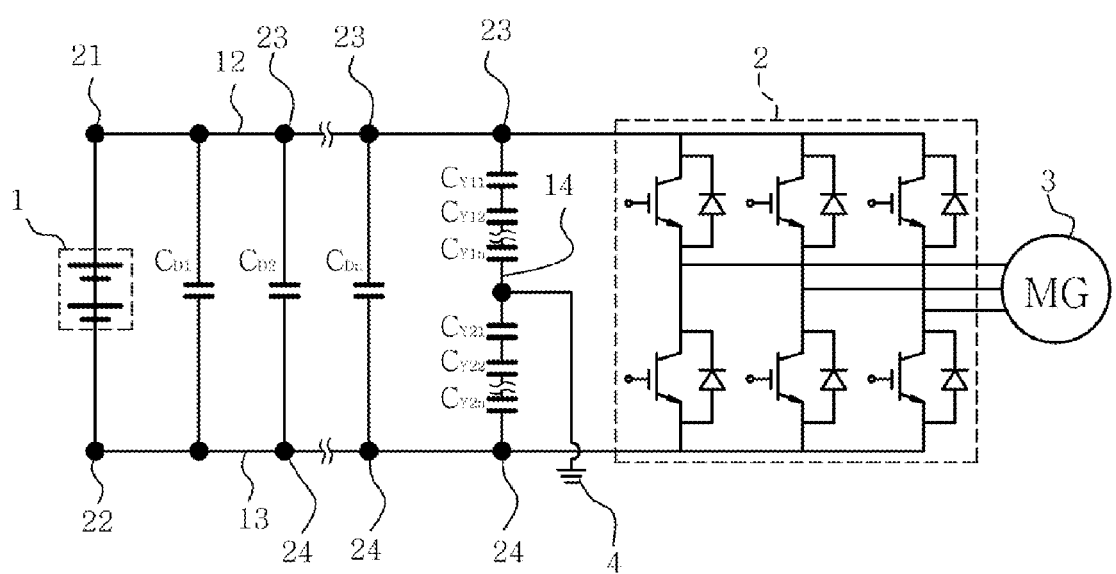
FIG. 10 is a circuit diagram of the DC link capacitor module of FIG. 1.

The third electrode substrate 14 is formed below the insulation substrate 11 to be separate from the second electrode substrate 13, and formed with a single pair of fourth via holes 14a and 14b into which the leads 31 and 32 of the first Y-capacitors ($C_{Y11}, C_{Y12}, C_{Y1n}$) or the second Y-capacitors ($C_{Y21}, C_{Y22}, \ldots, C_{Y2n}$)) are inserted, at the respective positions corresponding to the single pair of first via holes 11a and 11b. The single pair of fourth via holes 14a and 14b is connected to an external ground through a lead plate 25 as illustrated in FIG. 10, and is formed in the same structure of the single pair of third via holes 13a and 13b and thus, a further detailed description will be omitted.

As illustrated in FIGS. 3 and 4, two insulating cover substrates 15 are provided, and are formed above the first electrode substrate 12 and below the second electrode substrate 13 and the third electrode substrate 14, respectively. The insulating cover substrate 15 is formed with a plurality of fifth via holes 15a and 15b into which the leads 31 and 32 of the DC link capacitors ($C_{D1}, C_{D2}, \ldots, C_{Dn}$), the first Y-capacitors ($C_{Y11}, C_{Y12}, \ldots, C_{Y1n}$), or the second Y-capacitors ($C_{Y21}, C_{Y22}, \ldots, C_{Y2n}$) are inserted, at the respective positions corresponding to the second via holes 12a and 12b, the third via holes 13a and 13b, or the fourth via holes 14a and 14b.

As illustrated in FIGS. 2 and 4, the PCB 10 is formed by sequentially disposing the insulation substrate 11, the first electrode substrate 12, the second electrode substrate 13, the third electrode substrate 14, and the insulating cover substrate 15. A single pair of via hole units 10a and 10b is formed. The single pair of via hole units 10a and 10b is formed on the PCB 10 to be arranged in a matrix form. One via hole unit 10a of the single pair of via hole units 10a and 10b includes one of the first via hole 11a, the second via hole 12a, the third via hole 13a, and the fourth via hole 14a, and the fifth via hole 15a, thereby enabling the lead 31 to be electrically connected to the first electrode substrate 12. The remaining via hole unit 10b includes one of the first via hole 11b, the second via hole 12b, the third via hole 13b, and the fourth via hole 14b, and the fifth via hole 15b, thereby enabling the lead 32 to be electrically connected to the second electrode substrate 13 or the third electrode substrate 14. That is, one of the single pair of first via holes 11a and 11b, the single pair of second via holes 12a and 12b, and the single pair of third via holes 13a and 13b is electrically connected to the first electrode substrate 12 and the remaining one thereof is electrically connected to the second electrode substrate 13. One of the single pair of fourth via holes 14a and 14b is electrically connected to the first electrode substrate 12 and the remaining one thereof is electrically connected to the third electrode substrate 14.

Figure 5:
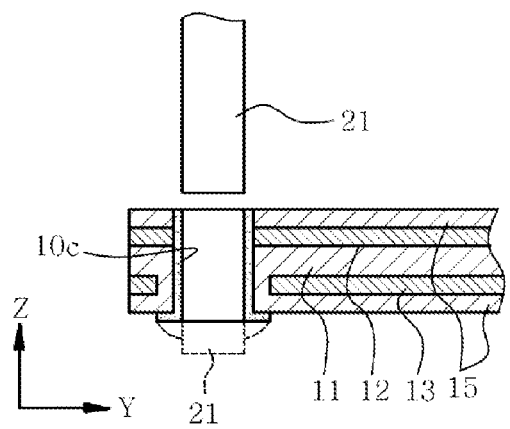
Figure 6:
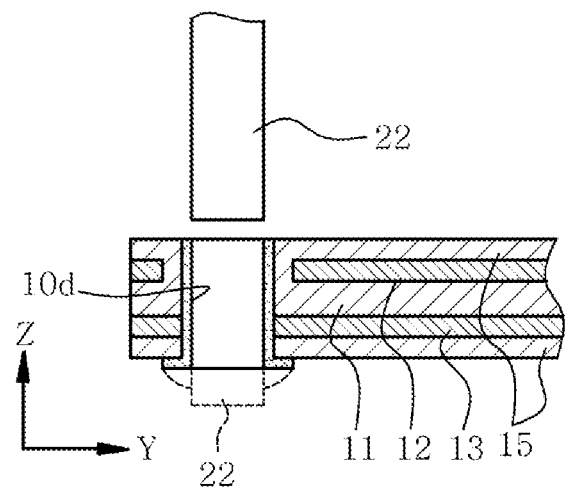

As illustrated in FIGS. 2, 5, and 6, a single pair of first plate insertion via holes 10c and 10d is formed on one side of the PCB 10, and a single pair of second plate insertion via holes 10e and 10f and a third plate insertion via hole 10g are formed on another side of the PCB 10.

One of the single pair of first plate insertion via holes 10c and 10d is electrically connected to the first electrode substrate 12 as illustrated in FIG. 5, and the remaining one thereof is electrically connected to the second electrode substrate 13 as illustrated in FIG. 6. One of the single pair of second plate insertion via holes 10e and 10f is formed to be identical to the first plate insertion via hole 10c and thereby electrically connected to the first electrode substrate 12. The remaining one thereof is formed to be identical to the first plate insertion via hole 10d and thereby electrically connected to the second electrode substrate 13. The third plate insertion via hole 10g is electrically connected to the third electrode substrate 14 of FIG. 3.

Lead plates 21, 22, 23, 24, and 25 are inserted and thereby installed into the single pair of first plate insertion via holes 10c and 10d formed on one side of the PCB 10, and the single pair of second plate insertion via holes 10e and 10f, and the third plate insertion via hole 10g formed on another side of the PCB 10. As illustrated in FIGS. 5 and 6, the lead plates 21, 22, 23, 24, and 25 are inserted and installed through soldering.

Among the lead plates 21, 22, 23, 24, and 25 inserted into the single pair of first plate insertion via holes 10c and 10d and thereby soldered, the lead plate 21 is electrically connected to the first electrode substrate 12 through the first plate insertion via hole 10c as illustrated in FIG. 5. The lead plate 22 is electrically connected to the second electrode substrate 13 through the first plate insertion via hole 10d as illustrated in FIG. 6. The lead plate 23 is formed to be identical to the lead plate 21 and thereby electrically connected to the first electrode substrate 12 through the second plate insertion via hole 10d. The lead plate 24 is formed to be identical to the lead plate 22 and thereby connected to the second electrode substrate 13 through the second plate insertion via hole 10e. As illustrated in FIG. 10, a plurality of pairs of lead plates 23 and 24 is formed to be arranged on the PCB 10 according to a driving method of an inverter 2. Also, the lead plate 25 is formed to be identical to the lead plate 22 and thereby electrically connected to the third electrode substrate 14 through the third plate insertion via hole 10g.

As illustrated in FIG. 10, the DC link capacitor module of the present invention is connected to a battery 1 and the inverter 2 connected to a motor 3 through the plurality of lead plates 21, 22, 23, 24, and 25 installed on the PCB 10. The battery 1 and the DC link capacitor module of the present invention supply power provided from the battery 1 to the first electrode substrate 12 and the second electrode substrate 13 through the lead plates 21 and 22. One of the first electrode substrate 12 and the second electrode substrate 13 operates as common ground and the remaining one thereof is supplied with the power. For example, when the second electrode substrate 13 is used as the common ground, the DC link capacitors ($C_{D1}, C_{D2}, \ldots, C_{Dn}$), the first Y-capacitors ($C_{Y11}, C_{Y12}, \ldots, C_{Y1n}$), or the second Y-capacitors ($C_{Y21}, C_{Y22}, \ldots, C_{Y2n}$) that are connected through soldering are connected in parallel or in series to the single pair of via hole units 10a and 10b formed on the PCB 10.

As illustrated in FIGS. 2 and 10, the DC link capacitor module of the present invention is connected to the inverter 2 through the lead plates 23 and 24. The first Y-capacitors ($C_{Y11}, C_{Y12}, \ldots, C_{Y1n}$) and the second Y-capacitors ($C_{Y21}, C_{Y22}, \ldots, C_{Y2n}$) are commonly grounded through the third electrode substrate 14 and then connected to an external common ground 4 through the lead plate 25. A known art is applied to an operation of the DC link capacitors ($C_{D1}, C_{D2}, \ldots, C_{Dn}$), the first Y-capacitors ($C_{Y11}, C_{Y12}, \ldots, C_{Y1n}$), or the second Y-capacitors ($C_{Y21}, C_{Y22}, \ldots, C_{Y2n}$) and thus, a further detailed description will be omitted.

By connecting in parallel or in series the DC link capacitors ($C_{D1}, C_{D2}, \ldots, C_{Dn}$), the first Y-capacitors ($C_{Y11}, C_{Y12}, \ldots, C_{Y1n}$), or the second Y-capacitors ($C_{Y21}, C_{Y22}, \ldots, C_{Y2n}$) using the first electrode substrate 12, the second electrode substrate 13, and the fourth electrode substrate 14 disposed on the PCB 10, a miniaturization and a fabrication may be easily implemented. By achieving low ESR using the first electrode substrate 12 and the second electrode substrate 13 formed within the PCB 10, it is possible to prevent a degradation in performance that occurs due to heat generation of the DC link capacitor module by ripple current. As illustrated in FIG. 2, a fastening hole 10h is formed on each corner of the PCB 10.

The fastening hole 10h is used for fastening the PCB 10 to a case 20 of FIG. 1 using a bolt or a nut (not shown).

Figure 7:
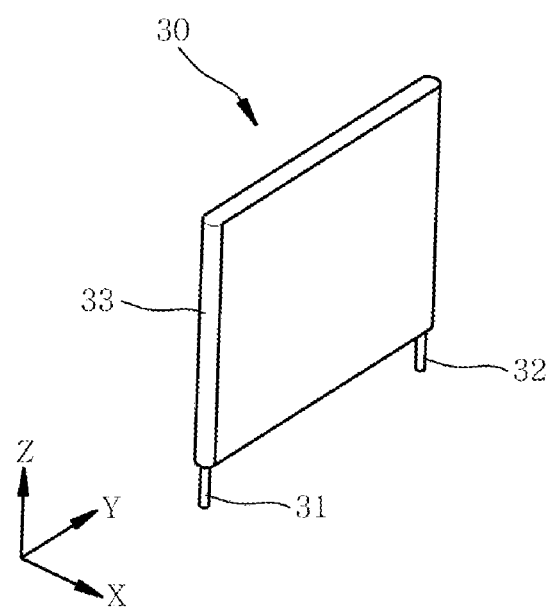
FIG. 7 is an enlarged perspective view of a DC link capacitor, a first Y-capacitor, or a second Y-capacitor of FIG. 2.
Figure 8:
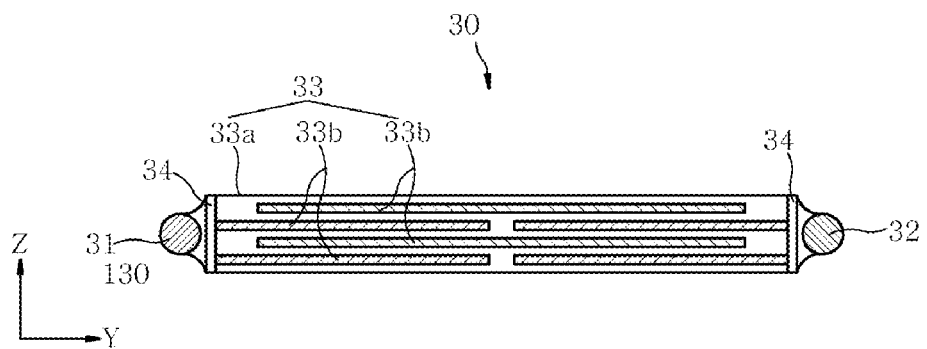
FIG. 8 is a side-cross-sectional view of the DC link capacitor, the first Y-capacitor, or the second Y-capacitor of FIG. 7.
Figure 9:
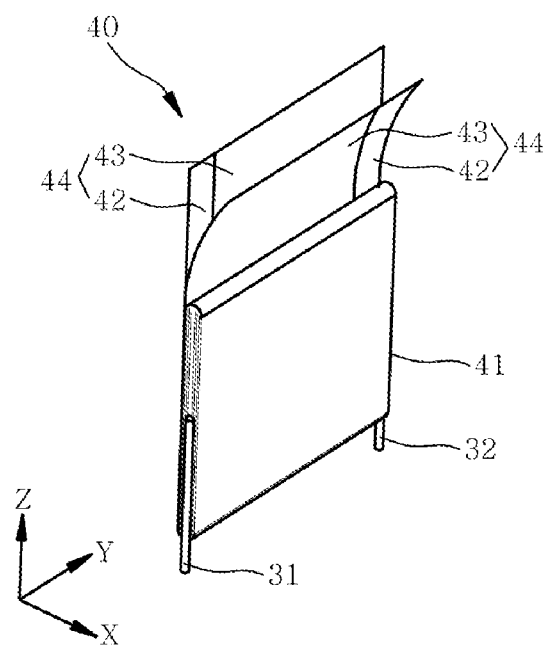
FIG. 9 is a perspective view illustrating another embodiment of the DC link capacitor, the first Y-capacitor, or the second Y-capacitor of FIG. 2.

As illustrated in FIGS. 7 through 9, one of a multilayer ceramic capacitor 30 and a film capacitor 40 is selected and used for the plurality of DC link capacitors ($C_{D1}, C_{D2}, \ldots, C_{Dn}$), the plurality of first Y-capacitors ($C_{Y11}, C_{Y12}, \ldots, C_{Y1n}$), and the plurality of second Y-capacitors ($C_{Y21}, C_{Y22}, \ldots, C_{Y2n}$) connected in parallel to the PCB 10. The multilayer ceramic capacitor 30 is used for the plurality of DC link capacitors ($C_{D1}, C_{D2}, \ldots, C_{Dn}$). The film capacitor 40 is used for each of the plurality of first Y-capacitors and the plurality of second Y-capacitors ($C_{Y21}, C_{Y22}, \ldots, C_{Y2n}$). Alternatively, the film capacitor 40 is used for the plurality of DC link capacitors ($C_{D1}, C_{D2}, \ldots, C_{Dn}$). The multilayer ceramic capacitor 30 is used for each of the plurality of first Y-capacitors ($C_{Y11}, C_{Y12}, \ldots, C_{Y1n}$) and the plurality of second Y-capacitors ($C_{Y21}, C_{Y22}, \ldots, C_{Y2n}$).

As illustrated in FIG. 8, the multilayer ceramic capacitor 30 includes a ceramic laminated body 33, a single pair of side electrode members 34, and a single pair of leads 31 and 32.

The ceramic laminated body 33 includes a sintered body 33a, a plurality of first internal electrodes 33b, and a plurality of second internal electrodes 33c. The sintered body 33a is formed by disposing and sintering a green sheet. The plurality of first internal electrodes 33b is sequentially disposed within the sintered body 33a, and each is formed to be electrically connected to one of the single pair of side electrode members 34. The plurality of second internal electrodes 33c is sequentially formed to intersect the first internal electrode 33b within the sintered body 33a, and each is formed to be electrically connected to the remaining one of the single pair of side electrode members 34.

The single pair of side electrode members 34 is formed at one side end and another side end of the ceramic laminated body 33, respectively. The single pair of leads 31 and 32 is bonded to the single pair of side electrode members 34, respectively, to thereby be electrically connected to one of the first electrode substrate 12, the second electrode substrate 13, and the third electrode substrate 14 through the via hole units 10a and 10b.

As illustrated in FIG. 9, the film capacitor 40 includes a metal film winder 41 and a single pair of leads 31 and 32. The metal film winder 41 is formed by winding a plurality of insulating films 44 on which a metal applied layer 43 is formed so as to form a non-deposition portion 42 at one side end or another side end. The single pair of leads 31 and 32 is bonded to one side end and another side end of the metal film winder 41, respectively. Here, the non-deposition portion 42 indicates an area on which a metal material is not applied.

As described above, a DC link capacitor module of the present invention may determine the number of DC link capacitors based on capacity of the DC link capacitor module and may connect the DC link capacitors in parallel using a first electrode substrate, a second electrode substrate, and a third electrode substrate formed within a PCB. Also, the DC link capacitor module may determine the number of first Y-capacitors or the number of second Y-capacitors based on the capacity and may connect the capacitors in series or in parallel. Accordingly, a miniaturization may be achieved, a fabrication may be facilitated, and an ESR characteristic may be enhanced. Accordingly, it is possible to prevent degradation in performance by high frequency ripple current.

Although a few exemplary embodiments of the present invention have been shown and described, the present invention is not limited to the described exemplary embodiments.

Instead, it would be appreciated by those skilled in the art that changes may be made to these exemplary embodiments without departing from the principles and spirit of the invention, the scope of which is defined by the claims and their equivalents.

What is claimed is:

1. A direct current (DC) link capacitor module, comprising:
   a printed circuit board (PCB) formed by sequentially disposing a first electrode substrate, an insulation substrate, a second electrode substrate, a third electrode substrate;
   a plurality of DC link capacitors connected in parallel to each of the first electrode substrate and the second electrode substrate;
   a plurality of first Y-capacitors connected in series to each of the first electrode substrate and the third electrode substrate, and connected in parallel to the DC link capacitors; and
   a plurality of second Y-capacitors connected in series to each of the first electrode substrate and the third electrode substrate, and connected in parallel to the first Y-capacitors,
   wherein the insulation substrate is formed so that a pair of first vial holes into which leads of the DC link capacitors, the first Y-capacitors, or the second Y-capacitors are inserted is arranged in a matrix form;
   the first electrode substrate is formed on the whole top surface of the insulation substrate, and formed with a single pair of second via holes into which the leads of the DC link capacitors, the first Y-capacitors, or the second Y-capacitors are inserted, at the respective positions corresponding to the single pair of first via holes;
   the second electrode substrate is formed below the insulation substrate, and formed with a single pair of third via holes into which the leads of the DC link capacitors are inserted, at the respective positions corresponding to the single pair of first via holes; and
   the third electrode substrate is formed below the insulation substrate to be separate from the second electrode substrate, and formed with a single pair of fourth via holes into which the leads of the first Y-capacitors or the second Y-capacitors are inserted, at the respective positions corresponding to the single pair of first via holes.

2. The DC link capacitor module of claim 1, wherein one of the single pair of first via holes, the single pair of second via holes, and the single pair of third via holes is electrically connected to the first electrode substrate and a remaining one thereof is electrically connected to the second electrode substrate.

3. The DC link capacitor module of claim 1, wherein one of the single pair of fourth via holes is electrically connected to the first electrode substrate, and a remaining one thereof is electrically connected to the third electrode substrate.

4. The DC link capacitor module of claim 1, wherein an insulating cover substrate is formed on the first electrode substrate or below the second electrode substrate and the third electrode substrate, and
   the insulating cover substrate is formed with a plurality of fifth via holes into which the leads of the DC link capacitors, the first Y-capacitors, or the second Y-capacitors are inserted, at the respective positions corresponding to the second via holes or the third via holes.

5. The DC link capacitor module of claim 1, wherein a single pair of first plate insertion via holes is formed on one side of the PCB, a single pair of second plate insertion via holes and a third plate insertion via hole are formed on another side of the PCB, one of the single pair of first plate insertion via holes and the single pair of second plate insertion via holes is electrically connected to the first electrode substrate, a remaining one thereof is electrically connected to the second electrode substrate, one of the third plate insertion via holes is electrically connected to the first electrode substrate, and a remaining one thereof is electrically connected to the third electrode substrate.

6. The DC link capacitor module of claim 5, wherein a lead plate is inserted into each of the first plate insertion via hole, the second plate insertion via hole, and the third plate insertion via hole.

7. The DC link capacitor module of claim 1, wherein one of a multilayer ceramic capacitor and a film capacitor is selected and used for each of the plurality of DC link capacitors, the plurality of first Y-capacitors, and the plurality of second Y-capacitors.

8. The DC link capacitor module of claim 7, wherein the multilayer ceramic capacitor comprises:
   a ceramic laminated body;
   a single pair of side electrode members formed at one side end and another side end of the ceramic laminated body, respectively;
   a single pair of leads bonded to the single pair of side electrode members, respectively, and
   the ceramic laminated body comprises a sintered body, a plurality of first internal electrodes sequentially disposed within the sintered body and each connected to one of the single pair of side electrode members, and a plurality of second internal electrodes sequentially formed to intersect the first internal electrode within the sintered body and each electrically connected to a remaining one of the single pair of side electrode members.

9. The DC link capacitor module of claim 7, wherein the film capacitor comprises:
   a metal film winder;
   a single pair of leads bonded at one side end and another side end of the metal film winder, respectively and,
   the metal film winder is formed by winding a plurality of insulating films applied with a metal material so that a non-deposition portion is to be formed at one side end or the other side end.

10. The DC link capacitor module of claim 1, wherein a multilayer ceramic capacitor is used for the plurality of DC link capacitor, and a film capacitor is used for each of the plurality of first Y-capacitors and the plurality of second Y-capacitors.

11. The DC link capacitor module of claim 1, wherein a film capacitor is used for the plurality of DC link capacitor, and a multilayer ceramic capacitor is used for each of the plurality of first Y-capacitors and the plurality of second Y-capacitors.

* * * * *